US006808949B2

(12) United States Patent
Lin et al.

(10) Patent No.: US 6,808,949 B2
(45) Date of Patent: Oct. 26, 2004

(54) TESTING METHODS OF OLED PANELS FOR ALL PIXELS ON

(75) Inventors: Shu-Hsin Lin, Yunlin Hsien (TW); Ming-Hsin Wu, Taoyuan Hsien (TW); Ju-Chung Chen, Taipei Hsien (TW); Yen-Lin Wang, Miaoli Hsien (TW)

(73) Assignee: RiTdisplay Corporation, Hsinchu (TW)

( * ) Notice: Subject to any disclaimer, the term of this patent is extended or adjusted under 35 U.S.C. 154(b) by 0 days.

(21) Appl. No.: 10/248,047

(22) Filed: Dec. 13, 2002

(65) Prior Publication Data

US 2003/0113942 A1 Jun. 19, 2003

(30) Foreign Application Priority Data

Dec. 13, 2001 (TW) ....................................... 90130874 A

(51) Int. Cl.[7] .......................... H01L 21/66; H01L 21/00

(52) U.S. Cl. ............................ 438/29; 438/14; 438/27; 257/686; 257/692; 257/758; 257/789

(58) Field of Search ................................ 257/686, 692, 257/758, 789; 438/14, 22, 26, 27, 29, 65

(56) References Cited

U.S. PATENT DOCUMENTS 6,593,011 B2 * 7/2003 Liu et al. .................... 428/690
6,661,180 B2 * 12/2003 Koyama ................. 315/169.3

FOREIGN PATENT DOCUMENTS

JP 06174750 * 6/1994 ........... G01R/1/073

* cited by examiner

*Primary Examiner*—Michael Trinh
*Assistant Examiner*—Pamela E Perkins
(74) *Attorney, Agent, or Firm*—Jiang Chyun IP Office

(57) ABSTRACT

The testing method of OLED panels for all pixels on are provided. The methods include positioning anisotropic conductive films and conductive plates over a set of exposed first electrodes and a set of exposed second electrodes. Through the anisotropic conductive film and the conductive plate, the set of first electrodes and the set of second electrodes conduct. Thereafter, the set of first electrodes is connected to a first voltage and the set of second electrodes is connected to a second voltage. Through the voltage difference between the first voltage and the second voltage, all the inside the OLED panels are lit to perform the test.

20 Claims, 6 Drawing Sheets

TESTING METHODS OF OLED PANELS FOR ALL PIXELS ON

CROSS REFERENCE TO RELATED APPLICATIONS

This application claims the priority benefit of Taiwan application serial no.90130874, filed on Dec. 13, 2001.

BACKGROUND OF INVENTION

1. Field of Invention

The present invention relates to testing methods of organic light emitting diode (OLED) panels for all pixels on. More particularly, the present invention relates to testing methods of using an anisotropic conductive film (ACF) together with a conductive plate timing control to carry out all pixels testing on organic light emitting diode (OLED) panels.

2. Description of Related Art

An organic light emitting diode (OLED) panel is usually tested using two major methods. One method of testing the OLED panel is to scan the panel using a system containing a driving chip and a control circuit board to scan the panel. The other method is to spread a layer of silver paste over the electrodes of an OLED panel so that the panel is globally driven because all the diode units are connected. If a driving chip is used to conduct a panel test, different driving chip and control circuit board must be used for a panel having different pixel size and pitch. Hence, considerable investment must be made in the design and development of a suitable driving chip to conduct the test. Moreover, a driving chip can hardly sustain a high current or a high voltage and hence the current and voltage that the driving chip can provide to test the panel is quite limited. In addition, the number of panel that can be tested at any one time is also limited by the chip-controlled circuit board.

On the other hand, spreading silver paste to render all the diode units inside the OLED panel connected often leads to other problems. Non-uniformity of the silver paste may lead to some unlit pixels. Moreover, in high temperature or high humidity test, the coated silver paste may peel off leading to a direct effect on the test panel.

Furthermore, if the silver paste is spread non-uniformly, current and voltage may concentrate on a few electrodes. Ultimately, a portion of the pixels on the panel may be damaged after the testing.

SUMMARY OF INVENTION

Accordingly, one object of the present invention is to provide testing methods of organic light emitting diode (OLED) panels for all pixels on that utilizes an anisotropic conductive film together with a conductive plate to light up all the diodes inside the panels.

To achieve these and other advantages and in accordance with the purpose of the invention, as embodied and broadly described herein, the invention provides testing methods of OLED panels for all pixels on. The methods include positioning anisotropic conductive films and conductive plates over a set of exposed first electrodes and a set of exposed second electrodes. Through the anisotropic conductive film and the conductive plate, the set of first electrodes and the set of second electrodes conduct. Thereafter, the set of first electrodes is connected to a first voltage and the set of second electrodes is connected to a second voltage. Through the voltage difference between the first voltage and the second voltage, all the pixels inside the OLEO panels are lit to perform the test.

In the testing methods of OLED panels for all pixels on of this invention, the conductive plate can be fabricated from any good conductor such as a copper foil. The first voltage and the second voltage can be provided through a power supplier. In addition, glue may be applied to the edge of the conductive plate to fix the conductive plate after bonding the conductive plate onto the anisotropic conductive film.

Furthermore, the testing methods of OLED panels for all pixels on according to this invention permits the concurrent testing of a plurality of OLED panels. To carry out concurrent testing of multiple OLED panels, a conductive plate is used to connect serially all the first electrodes of the OLED panels or a conductive plate is used to connect serially all the second electrodes of the OLED panels. Alternatively, a first conductive plate is used to connect serially all the first electrodes while a second conductive plate is used to connect serially all the second electrodes of the OLED panels.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the Invention, and are incorporated in and constitute a part of this specification. The drawings illustrate embodiments of the invention and, together with the description, serve to explain the principles of the invention. In the drawings.

DETAILED DESCRIPTION

Figure 1:
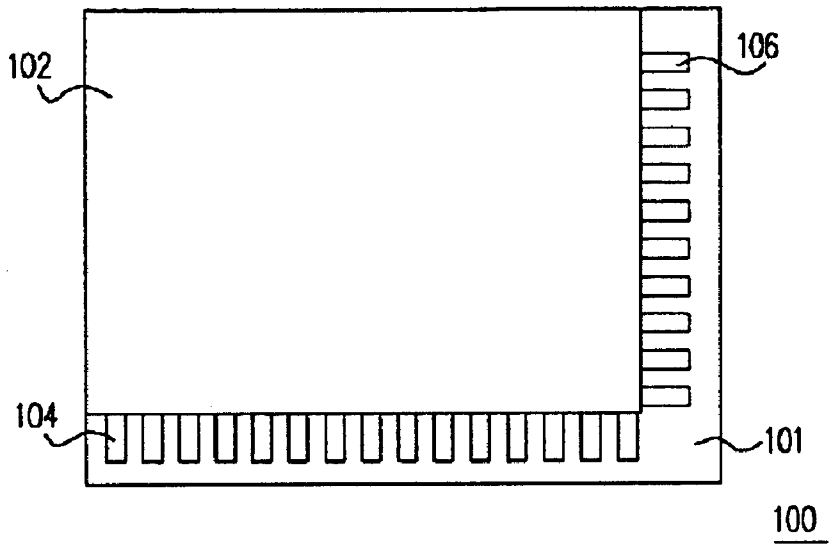
FIGS. 1 to 3 are top views showing the steps for carrying out the testing of an OLED panel through anisotropic conductive films and conductive plates according to a first embodiment of this invention.

Reference will now be made in detail to the present preferred embodiments of the invention, examples of which are illustrated In the accompanying drawings. Wherever possible, the same reference numbers are used in the drawings and the description to refer to the same or like parts.

Figure 2:
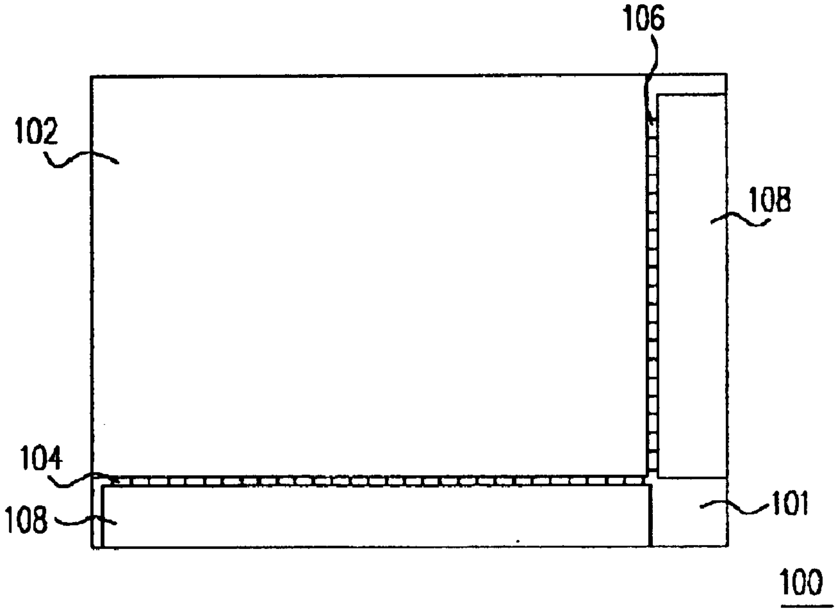
Figure 3:
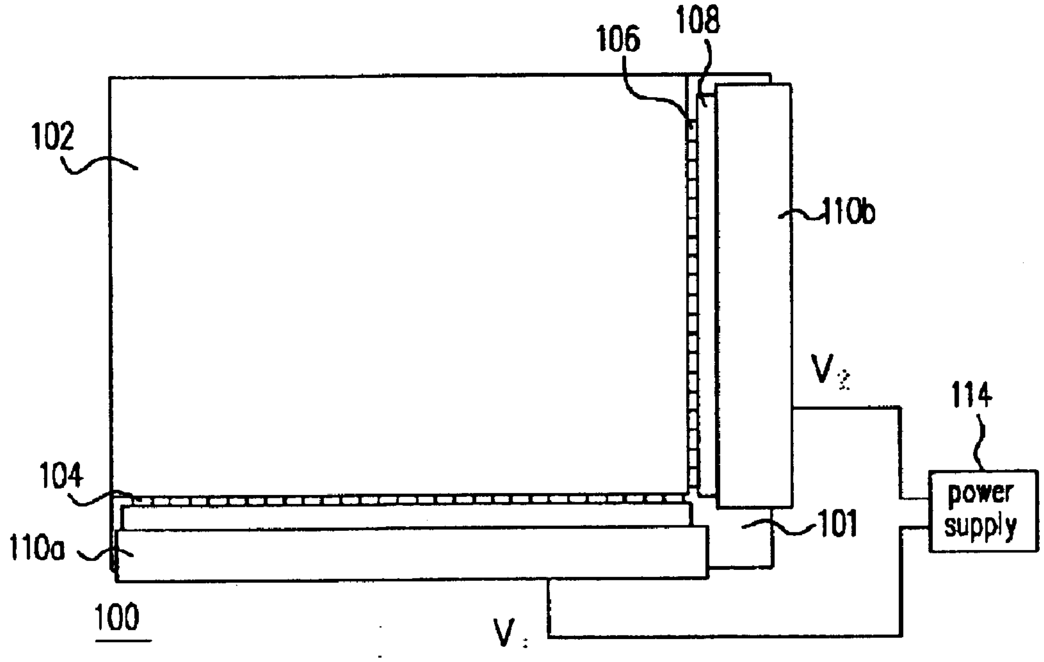

FIGS. 1 to 3 are top views showing the steps for carrying out the testing of an organic light emitting diode (OLED) panel through anisotropic conductive films and conductive plates according to a first embodiment of this invention. As shown in FIG. 1, an organic light emitting diode (OLED) panel 100 is provided. The OLED panel 100 has a display region 102 and a non-display region 101. The non-display region 101 has a plurality of first electrodes 104 and a plurality of second electrodes 106. Both the first electrodes 104 and the second electrodes 106 extend from the display region 102. The set of first electrodes 104 and the set of second electrodes 106 are perpendicularly attached to the OLED panel 100. A light-emitting layer is positioned between the first electrodes 104 and the second electrodes 106. Through the application of a voltage to the first electrodes 104 and the second electrodes 106, the light-emitting layer is powered up to emit light so that images are displayed on the panel.

To test the OLED panel 100, an anisotropic conductive film (ACF) 108 is placed over the first set of electrodes 104 and the second set of electrodes 106 respectively as shown in FIG. 2.

Figure 4:
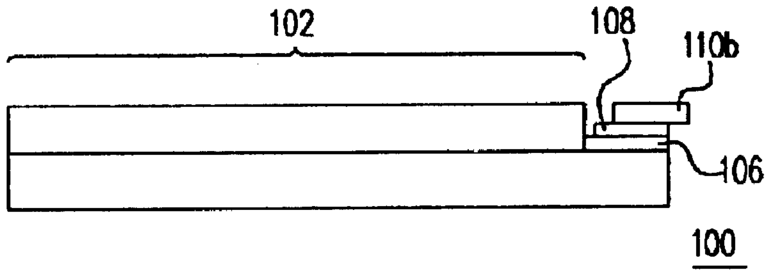
FIG. 4 is a cross-sectional view of FIG. 3.

As shown in FIGS. 3 and 4, where FIG. 4 is a cross-sectional view of FIG. 3, a first conductive plate 110*a* and a second conductive plate 110*b* made from a highly conductive material such as copper foil are provided. The conductive plates 110*a* and 110*b* are placed over the respective anisotropic conductive film 108. Thereafter, pressure and heat are applied so that the conductive plates 110*a* and 110*b* are electrically connected to the first electrodes 104 and the second electrodes 106 through conductive particles within the anisotropic conductive films 108.

The conductive plate 110*a* renders all the first electrodes 104 conductive and the conductive plate 110b renders all the second electrodes 106 conductive. Furthermore, the first conductive plate 110*a* and the second conductive plate 110*b* may be connected to a power supplier 114. The power supplier 114 supplies a first voltage V1 to the first conductive plate 110*a* and a second voltage V2 to the second conductive plate 110*b*. Since all the first electrodes 104 and the second electrodes 106 are electrically connected to the first conductive plate 110*a* and the second conductive plate 110*b* respectively, all the diodes within the OLED panel 100 are powered to perform the test.

Figure 5:
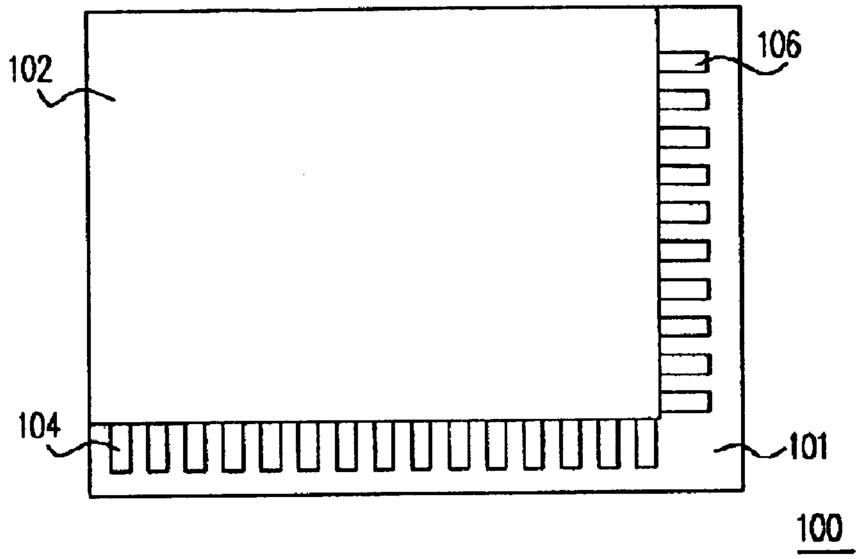
FIGS. 5 to 7 are top views showing the steps for carrying out the testing of an OLED panel through anisotropic conductive films and conductive plates according to a second embodiment of this invention.
Figure 6:
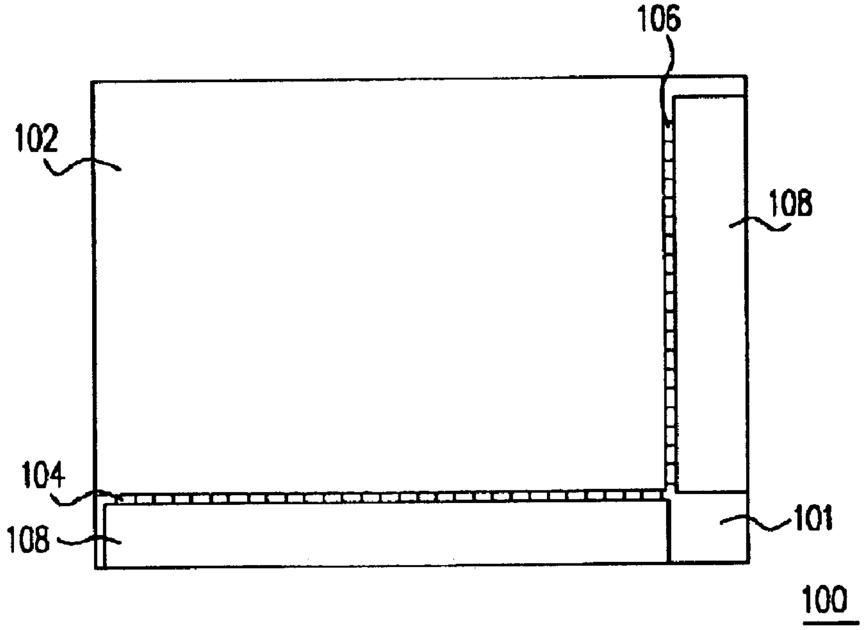
Figure 7:
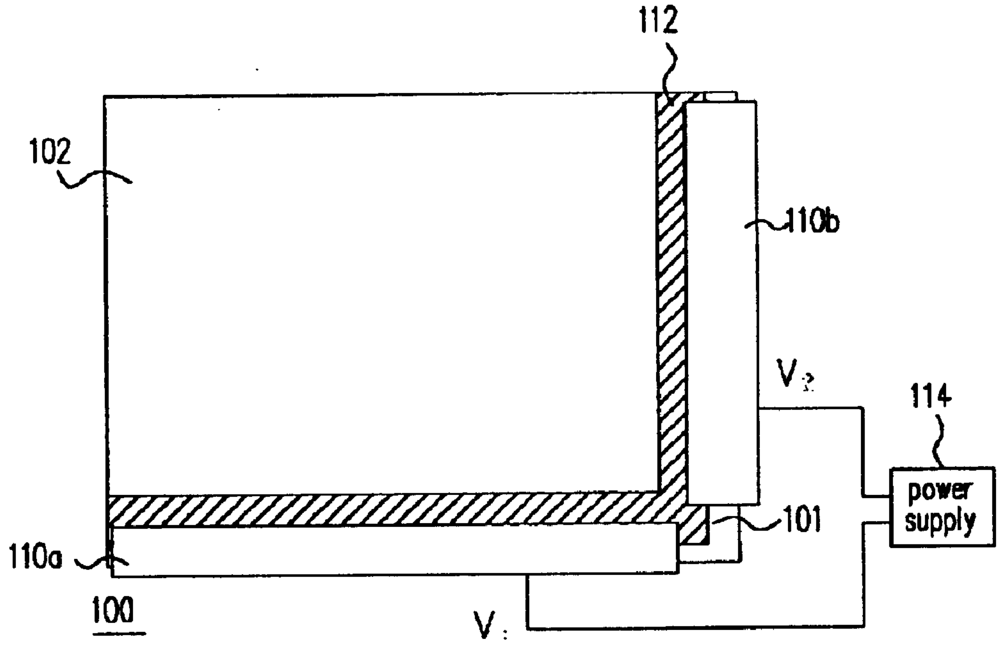

FIGS. 5 to 7 are top views showing the steps for carrying out the testing of an OLED panel through anisotropic conductive films and conductive plates according to a second embodiment of this invention. As shown in FIG. 5, an organic light emitting diode (OLED) panel 100 is provided. The OLED panel 100 has a display region 102 and a non-display region 101. The non-display region 101 has a plurality of first electrodes 104 and a plurality of second electrodes 106. Both the first electrodes 104 and the second electrodes 106 extend from the display region 102. The set of first electrodes 104 and the set of second electrodes 106 are perpendicularly attached to the OLED panel 100. A light-emitting layer is positioned between the first electrodes 104 and the second electrodes 106. Through the application of a voltage to the first electrodes 104 and the second electrodes 106, the light-emitting layer is powered up to emit light so that images are displayed on the panel.

To test the OLED panel 100, an anisotropic conductive film (ACF) 108 is placed over the first set of electrodes 104 and the second set of electrodes 106 respectively as shown in FIG. 6.

Figure 8:
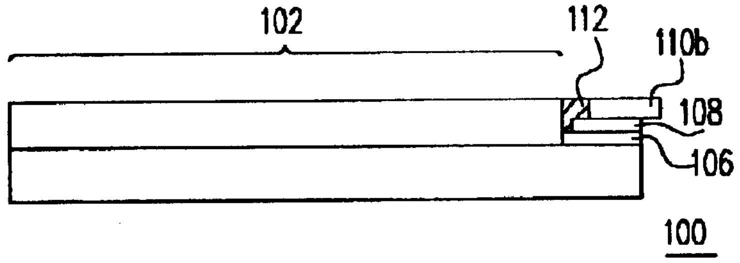
FIG. 8 is a cross-sectional view of FIG. 7.

As shown in FIGS. 7 and 8, where FIG. 8 is a cross-sectional view of FIG. 7, a first conductive plate 110*a* and a second conductive plate 110*b* made from a highly conductive material such as copper foil are provided. The conductive plates 110*a* and 110*b* are placed over the respective anisotropic conductive film 108. Thereafter, pressure and heat are applied so that the conductive plates 110*a* and 110*b* are electrically connected to the first electrodes 104 and the second electrodes 106 through conductive particles within the anisotropic conductive films 108. Adhesive glue 112 is applied to the edges of the conductive plates 110*a* and 110*b* so that both conductive plates 110*a* and 110*b* are stationed on the panel. The adhesive glue 112 can be silicone glue, for example. The application of adhesive glue 112 prevents the conductive plates 110*a* and 110*b* from peeling off the OLED electrodes.

The conductive plate 110*a* renders all the first electrodes 104 conductive and the conductive plate 110*b* renders all the second electrodes 106 conductive. Furthermore, the first conductive plate 110*a* and the second conductive plate 110*b* may be connected to a power supplier 114. The power supplier 114 supplies a first voltage V1 to the first conductive plate 110*a* and a second voltage V2 to the second conductive plate 110*b*. Since all the first electrodes 104 and the second electrodes 106 are electrically connected to the first conductive plate 110*a* and the second conductive plate 110*b* respectively, all the diodes within the OLED panel 100 are powered to perform the test.

Figure 9:
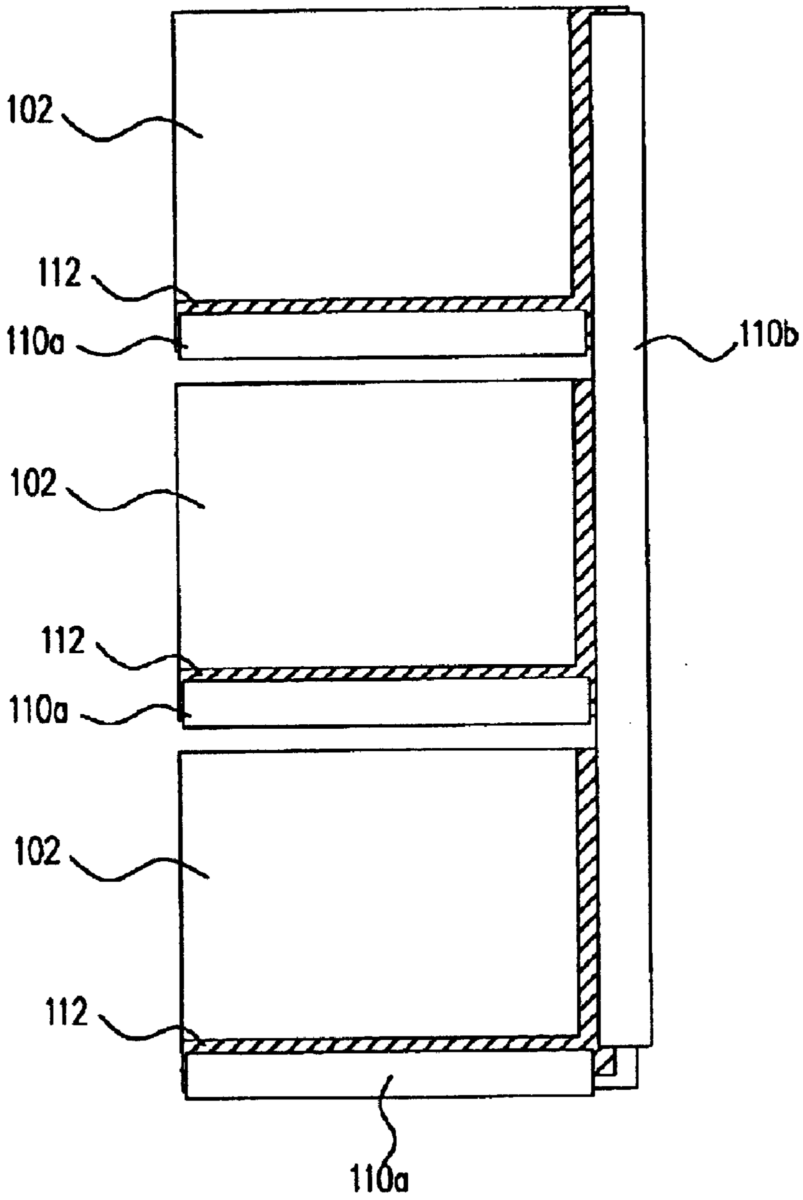
FIGS. 9 and 10 are-top views showing two configurations for carrying out the testing of a plurality of OLED panels concurrently according to a third preferred embodiment of this invention.
Figure 10:
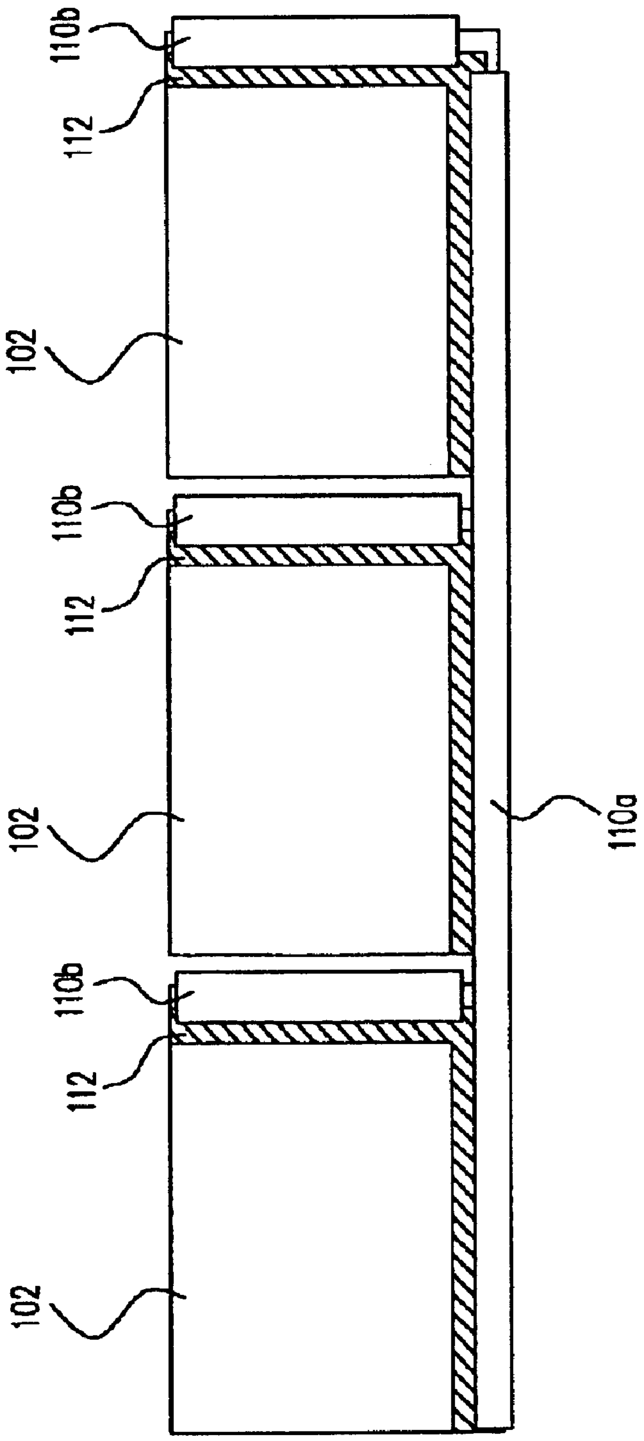

FIGS. 9 and 10 are top views showing two configurations for carrying out the testing of a plurality of OLED panels concurrently according to a third preferred embodiment of this invention. When a plurality of OLED panels 100 are lined up as shown in FIG. 9 for a concurrent test, a common conductive plate 110*b* connects all the second electrodes 106. An alternative alignment of the OLED panels 100 is shown in FIG. 10. Here, a common conductive plate 110*a* connects all the first electrodes 104 together.

The arrangement of OLED panels 100 in FIGS. 9 and 10 is able to withstand very high current and voltage. Hence, there is little problem is conducting the testing.

The second electrodes 106 of a plurality of OLED panels 100 are serially connected together through the conductive plate 110*b* as shown in FIG. 9. Meanwhile, the first electrodes 104 of a plurality of OLED panels 100 are serially connected together through the conductive plate 110*a* as shown in FIG. 10. This invention also permits a conductive plate 110*a* to connect all the first electrodes 104 of the OLED panels 100 and a conductive plate 110*b* to connect all the second electrodes 106 of the OLED panels 100.

The advantages of using the anisotropic conductive films, the conductive plates and the fastening glue (selectively) to prepare for the test can be compared with a conventional arrangement in Table 1.

TABLE 1

| Items | According to this Invention | Driving Chip | Silver Paste Coating |
|---|---|---|---|
| Cost factor | Low cost | Expensive to develop and fabricate | Cost is intermediate between the driving chip method and the invention. |
| Time factor | Any time after wiring | Longer development period | Any time after wiring |
| Environ-mental factor | Not affected by environmental temperature and humidity | Driving chip easily affected by environmental temperature and humidity | Coverage and reactance influenced by environmental temperature, humidity |
| Testing accuracy | Highly accurate | Driving chip signal easily interfered by environmental factors | Error prone due to poor display effect |
| Effect of Display | Display is good | Display is good. | Display is poor. |

In summary, the testing methods of OLED panels for all pixels on according to this invention has the following advantages:

1. Using anisotropic conductive films together with conductive plates to connect up all the diodes inside the panel permits the flow of a larger current or the use of a higher voltage during the testing.
2. A testing of a multiple of OLED panels can be carried out through serial or parallel current connection.

3. The anisotropic conductive films are prevented from peeling off from the panel during testing through the application of some fastening glue.

4. The OLED panel test can be carried out at all sorts of temperature and humidity environment without much adverse effect.

5. Cost of carrying out the test of OLED panels are considerably lower than the conventional methods such as the driving chip or the silver paste coating method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A testing method of organic light emitting diode (OLED) panel for all pixels on, comprising the steps of:

providing an organic light emitting diode (OLED) panel, wherein the OLED panel has a display region and a non-display region and the non-display region has a plurality of first electrodes and a plurality of second electrodes;

attaching a first anisotropic conductive film over the first electrodes;

attaching a first conductive plate over the first anisotropic conductive film;

attaching a second anisotropic conductive film over the second electrodes;

attaching a second conductive plate over the second anisotropic conductive film; and connecting the first conductive plate to a first voltage and connecting the second conductive plate to a second voltage for driving the display region.

2. The testing method of organic light emitting diode (OLED) panel for all pixels on of claim 1, wherein the first electrodes extend in a direction perpendicular to the second electrodes.

3. The testing method of organic light emitting diode (OLED) panel for all pixels on of claim 1, wherein the first conductive plates are fabricated using copper foils.

4. The testing method of organic light emitting diode (OLED) panel for all pixels on of claim 1, wherein the second conductive plates are fabricated using copper foils.

5. The testing method of organic light emitting diode (OLED) panel for all pixels on of claim 1, wherein after attaching conductive plate over the anisotropic conductive film, further includes applying fastening glue to the edges of the conductive plate so that the plate is fixed in position.

6. The testing method of organic light emitting diode (OLED) panel for all pixels on of claim 5, wherein the fastening glue includes a silicone glue.

7. A testing method of organic light emitting diode (OLED) panels for all pixels on, comprising the steps of:

providing a plurality of organic light emitting diode (OLED) panels each having a display region and a non-display region, wherein each non-display region has a plurality of first electrodes and a plurality of second electrodes;

attaching a plurality of first anisotropic conductive films over the first electrodes of the respective OLED panels;

attaching a first conductive plate over the first anisotropic conductive films to connect all the first anisotropic conductive films serially;

attaching a plurality of second anisotropic conductive films over the second electrodes of the respective OLED panels;

attaching a plurality of second conductive plates over the respective second anisotropic conductive films; and connecting the first conductive plate to a first voltage and connecting the second conductive plates to a second voltage for driving the display region of all the OLED panels.

8. The testing method of organic light emitting diode (OLED) panels for all pixels on of claim 7, wherein the first electrodes extend in a direction perpendicular to the second electrodes.

9. The testing method of organic light emitting diode (OLED) panels for all pixels on of claim 7, wherein the first conductive plates are fabricated using copper foil.

10. The testing method of organic light emitting diode (OLED) panels for all pixels on of claim 7, wherein the second conductive plates are fabricated using copper foil.

11. The testing method of organic light emitting diode (OLED) panels for all pixels on of claim 7, after attaching conductive plate over the anisotropic conductive film, further includes applying fastening glue to the edges of the conductive plate so that the plate is fixed in position.

12. The testing method of organic light emitting diode (OLED) panels for all pixels on of claim 11, wherein the fastening glue includes a silicone glue.

13. A testing method of organic light emitting diode (OLED) panels for all pixels on, comprising the steps of:

providing a plurality of organic light emitting diode (OLED) panels each having a display region and a non-display region, wherein each non-display region has a plurality of first electrodes and a plurality of second electrodes;

attaching a plurality of first anisotropic conductive films over the first electrodes of the respective OLED panels;

attaching a first conductive plate over the first anisotropic conductive films to connect all the first anisotropic conductive films serially;

attaching a plurality of second anisotropic conductive films over the second electrodes of the respective OLED panels;

attaching a second conductive plate over the respective second anisotropic conductive films so that the second anisotropic conductive films are serially connected; and connecting the first conductive plate to a first voltage and connecting the second conductive plate to a second voltage for driving the display region of all the OLED panels.

14. The testing method of organic light emitting diode (OLED) panels for all pixels on of claim 13, wherein the first electrodes extend in a direction perpendicular to the second electrodes.

15. The testing method of organic light emitting diode (OLED) panels for all pixels on of claim 13, wherein the first conductive plates are fabricated using copper foil.

16. The testing method of organic light emitting diode (OLED) panels for all pixels on of claim 13, wherein the second conductive plates are fabricated using copper foil.

17. The testing method of organic light emitting diode (OLED) panels for all pixels on of claim 13, after attaching conductive plate over the anisotropic conductive film, further includes applying fastening glue to the edges of the conductive plate so that the plate is fixed in position.

18. The testing method of organic light emitting diode (OLED) panels for all pixels on of claim 17, wherein the fastening glue includes a silicone glue.

19. A testing equipment of an organic light emitting diode (OLED) panel for all pixels on, wherein the organic light emitting diode (OLED) panel has a plurality of first electrodes and a plurality of second electrodes, the testing equipment comprising:

a first anisotropic conductive film disposed over the first electrodes;

a second anisotropic conductive film disposed over the second electrodes;

a first conductive plate disposed over the first anisotropic conductive film, wherein the first conductive plate is electrically connected with the first electrodes through the first anisotropic conductive film;

a second conductive plate disposed over the second anisotropic conductive film, wherein the second conductive plate is electrically connected with the second electrodes through the second anisotropic conductive film; and a power supplier electrically connected to the first conductive plate and the second conductive plate.

20. A testing equipment of organic light emitting diode (OLED) panels for all pixels on, wherein each of the organic light emitting diode (OLED) panels has a plurality of first electrodes and a plurality of second electrodes, the testing equipment comprising:

a plurality of first anisotropic conductive films disposed over the first electrodes;

a plurality of second anisotropic conductive films disposed over the second electrodes;

a plurality of first conductive plates disposed over the first anisotropic conductive films respectively, wherein the first conductive plates are electrically connected with the first electrodes through the first anisotropic conductive films;

a common conductive plate disposed over all the second anisotropic conductive films, wherein the second conductive plate is electrically connected with all the second electrodes through the second anisotropic conductive films; and a power supplier electrically connected to the first conductive plate and the common conductive plate.

* * * * *